(12) United States Patent
Gardiner et al.

(10) Patent No.: US 6,545,716 B2
(45) Date of Patent: Apr. 8, 2003

(54) CAMERA BODY FOR PROTECTING COMPONENTS

(76) Inventors: Tracey Gardiner, Box 1586, Martensville, Saskatchewan (CA), S0K 2T0; Blaine Linn, Box 1586, Martensville, Saskatchewan (CA), S0K 2T0

( * ) Notice: Subject to any disclaimer, the term of this patent is extended or adjusted under 35 U.S.C. 154(b) by 0 days.

(21) Appl. No.: 09/950,784

(22) Filed: Sep. 13, 2001

(65) Prior Publication Data

US 2003/0048377 A1 Mar. 13, 2003

(51) Int. Cl.[7] .............. H04N 5/225; H05K 5/06
(52) U.S. Cl. .............. 348/374; 348/373; 174/52.2
(58) Field of Search ............... 348/373, 374, 348/376; 172/52.2, 52.3, 52.4

(56) References Cited

U.S. PATENT DOCUMENTS 5,519,936 A * 5/1996 Andros ................ 174/52.4
6,355,881 B1 * 3/2002 Braeges ................ 174/52.3
2002/0044215 A1 * 4/2002 Takagi et al. ............ 348/374

* cited by examiner

Primary Examiner—Wendy R. Garber
Assistant Examiner—Catherine Toppin
(74) Attorney, Agent, or Firm—Nixon & Vanderhye P.C.

(57) ABSTRACT

A video camera apparatus comprises a camera body and camera components, including a lens operative to view an exterior of the camera body, enclosed in an interior of the camera body. Connectors lead from the camera components to the exterior of the camera body. A solid filler material substantially covers the camera components and secures the camera components in a fixed location with respect to the camera body. The filler material has sufficient insulating properties to prevent generation of a current through the filler material by voltages normally encountered on exposed portions of the camera components. The filler material is injected into the camera body in a fluid state, and then hardens to a solid state.

10 Claims, 1 Drawing Sheet

CAMERA BODY FOR PROTECTING COMPONENTS

This invention is in the field of video cameras and in particular camera bodies that protect the camera components from vibration and exposure to the environment.

BACKGROUND

Video cameras are used in all sorts of different industries to visually monitor various activities and locations. Often these cameras are subject to hostile ambient conditions, and exposed to vibration, dust, corrosive fumes, moisture, and the like that can lead to premature malfunctioning of the camera. As well cold can be detrimental to the operation of the camera and require added heating elements.

Typically such cameras are made up of various components mounted in a camera body. For example the popular charge coupled device (CCD) camera components are mounted on one or more printed circuit boards that are operatively connected to a lens. Such cameras may be purchased with the circuit boards mounted in a camera body with the lens extending through an opening in the body, and output and power connecting wires leading from the circuit boards out of the camera body. Alternatively the circuit boards and lens can be purchased alone and these can be mounted in such manner as the customer desires.

Conventionally protection from ambient conditions is provided by sealing the camera body to prevent contact of the camera components with the ambient air. Resilient mounts are commonly provided to reduce vibration, and heaters are provided to ensure proper operation in cold conditions.

U.S. Pat. No. 5,089,895 to Fraker et al. discloses a camera body encapsulated in a plastic material. The camera body is placed in a mold, and a plastic material such as urethane, silicone, polystyrene or the like is injected into the mold. When the plastic material hardens, the mold is removed. The camera body is thus encased in the plastic material, which is exposed to ambient conditions. The process requires significant time for preparation of a mold, properly placing the camera in the mold, injecting and hardening the plastic material, and then removing the mold. As well, the camera components are still subject to vibration inside the camera body.

SUMMARY OF THE INVENTION

It is the object of the present invention to provide a video camera apparatus wherein components of the camera are protected from exposure to ambient conditions.

It is a further object of the invention to provide such an apparatus wherein components of the camera are encapsulated in a solid filler material such that portions of the components are inhibited from moving with respect to each other.

It is a further object of the invention to provide a method of making a video camera apparatus wherein components of the camera are encapsulated in a solid filler material.

The invention provides, in one aspect, a video camera apparatus comprising a camera body and a lens attached to the camera body and operative to view an exterior of the camera body. A plurality of camera components is substantially enclosed in an interior of the camera body and operatively connected to the lens. Connectors lead from the camera components to the exterior of the camera body and are operative to transmit images viewed by the lens to a remote viewer. A solid filler material substantially covers the camera components and secures the camera components in a fixed location with respect to the camera body. The filler material has sufficient insulating properties to prevent generation of a current through the filler material by voltages normally encountered on exposed portions of the camera components. The filler material is injected into the camera body in a fluid state, and then hardens to a solid state.

The invention provides, in a second aspect, a method of assembling a video camera apparatus comprising substantially enclosing a plurality of camera components in an interior of a camera body and attaching a lens to the camera body and orienting the lens such that the lens is operative to view an exterior of the camera body. The lens is operatively connected to the camera components. Connectors are provided leading from the camera components to the exterior of the camera body, the connectors operative to transmit images viewed by the lens to a remote viewer. A fluid filler material is injected into the camera body so as to substantially cover the components and so as to fill at least a portion of a space between each camera component and an interior wall of the camera body to secure the camera components in a fixed location with respect to the camera body when the filler material hardens. The fluid filler material is allowed to harden to a solid state. The filler material has sufficient insulating properties to prevent generation of a current through the filler material by voltages normally encountered on exposed portions of the camera components.

The camera of the invention thus has a camera body that contains the required components for the operation of the camera connected to a lens. When the camera will be working in a harsh environment, where the ambient air carries dust, moisture, corrosive gases, and so forth, it is necessary to prevent the ambient air from contacting the camera components. Conventionally the camera body is sealed around the lens, connectors, and body cover to prevent the entry of ambient air, liquids, gases and so forth into the cavity containing the camera components. In the camera of the invention, the camera components are covered with the solid filler material such that these ambient conditions are prevented from contacting the camera components. Further the filler material secures the camera components in the camera body by filling at least a portion of the space between the components and the inside wall of the camera body. Further the filler material insulates the camera components and can allow operation in colder conditions without adding a heater. Conveniently the cavity is simply substantially filled with a solid filler material, such as silicone, which occupies substantially all the space inside the camera body that is not occupied by camera components.

The camera components may have operating voltages on exposed surfaces. The filler material must have insulating properties that will not allow a current or "short" to be generated from one portion of the components to another through the filler material.

Often cameras are exposed to vibration that can cause component connections to break as one portion of the components moves with respect to the other portions. In the camera of the invention, the solid filler material inhibits such relative movement.

The filler material is one of a number of known materials that can be injected into the camera body in a fluid state, and then hardens as a result of exposure to air, or heat or the like. Silicone compounds can be used which will harden into a resilient block. These are inexpensive and easily injected by a caulking gun for example. Alternatively, epoxy compounds or the like can be used which harden into a rigid block.

DESCRIPTION OF THE DRAWINGS

While the invention is claimed in the concluding portions hereof, preferred embodiments are provided in the accompanying detailed description which may be best understood in conjunction with the accompanying diagrams where like parts in each of the several diagrams are labeled with like numbers, and where:

DETAILED DESCRIPTION OF THE ILLUSTRATED EMBODIMENTS

Figure 1:
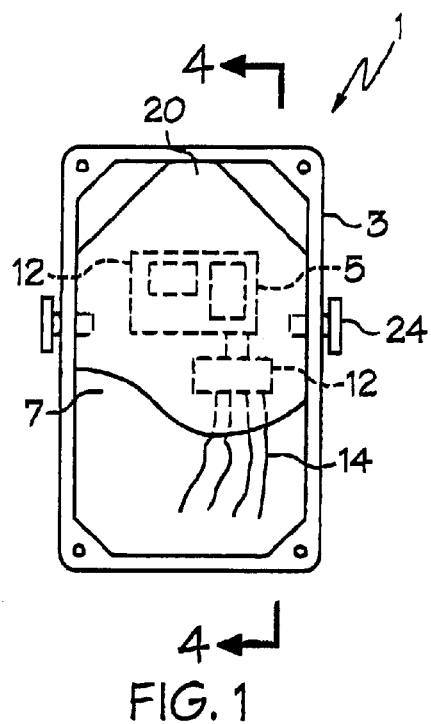
FIG. 1 is a rear view of a video camera of the invention with the back cover removed.
Figure 2:
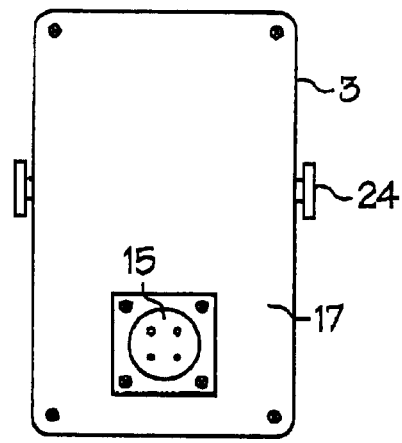
FIG. 2 is a rear view of the video camera of FIG. 1 with the back cover in place.
Figure 3:
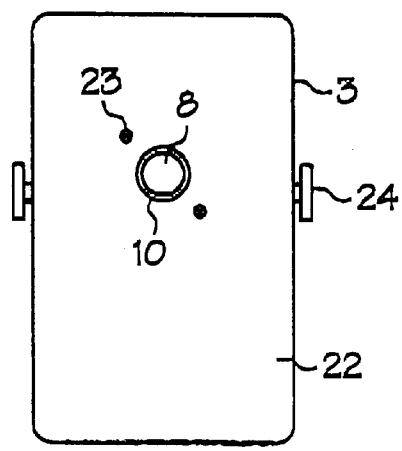
FIG. 3 is a front view of the video camera of FIG. 1.
Figure 4:
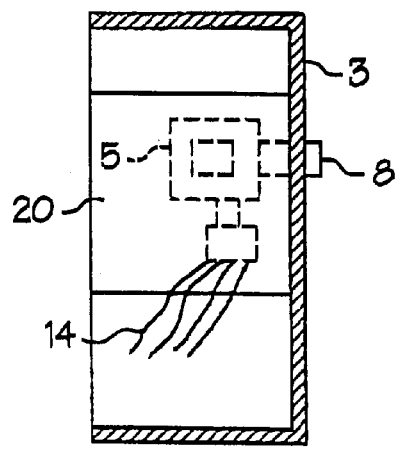
FIG. 4 is a cross-section view along line 4—4 in FIG. 1.

FIGS. 1–4 illustrate a video camera apparatus 1. The apparatus comprises a camera body 3 and camera components 5 substantially enclosed in an interior 7 of the camera body 3. A lens 8 is operative to view an exterior of the camera body 3 through an opening 10 in the camera body 3. For a charge coupled device (CCD) camera as illustrated, the camera components 5 will typically be mounted on one or more circuit boards 12 operatively connected to the lens 8. Other camera types have various components as are well known in the art. Connectors lead from the camera components to the exterior of the camera body and are operative to transmit images viewed by the lens to a remote viewer.

Connectors for output, power and the like lead from the camera components 5 to the exterior of the camera body 3 and are operative to transmit images viewed by the lens to a remote viewer. As illustrated, the connectors are wires 14 that are connected to the connection socket 15 on the back cover 17 of the apparatus 1.

A filler material such as a silicone compound 20 is injected into the camera body 3 in a fluid state and allowed to harden into a solid state. The silicone compound 20 is injected until it covers the camera components 5 and fills at least a portion of the space between each camera component 5 and the interior wall of the camera body 3. In the resulting apparatus 1 a solid silicone filler material 20 covers the camera components 5 and secures the camera components 5 in a fixed location with respect to the camera body 3. Conveniently the camera components 5 are first placed into the interior 7 of the camera body 3. In the illustrated embodiment, the lens 8 is attached to the front wall 22 of the camera body 3 with screws 23. The circuit boards 12 can be attached to the lens 8 and are then held in place by the screws 23 as well while the silicone compound 20 is injected. Alternatively, the lens 8 is oriented in the camera body 3 so as to view through the opening 10 in the camera body 3, and then some silicone compound 20 is injected and the circuit boards 12 are placed into the silicone compound 20, and more silicone compound 20 is injected. As illustrated the silicone compound 20 fills only that portion of the interior 7 of the camera body 3 that is adjacent to the camera components 5 and is sufficient to cover the camera components 5 and fill at least a portion of the space between the camera components 5 and the interior wall of the camera body 3.

Conveniently, the silicone compound can simply be injected to substantially fill the interior 7 of the camera body 3. It is convenient to leave a substantial length of wires 14 free of the filler material to allow for easy attachment to the socket 15 when the filler material hardens. The screws 23 attaching the lens 8 can be removed once the filler material hardens, or left in place.

Exposed portions on the surface of the camera components 5 may be bare and require insulation to prevent generating a short from one portion of the components 5 to another, or to the camera body 3. The filler material has sufficient insulating properties to prevent generation of a current through the filler material by voltages normally encountered on exposed portions of the camera components 5. A suitable silicone compound is General Electric™ Silicone RTV 128.

The silicone compound filler material 20 hardens to a resilient solid state, which cushions the camera components 5, and inhibits movement of the camera components 5 with respect to each other. Alternative filler material such as an epoxy compound could be used which hardens into a rigid solid state.

The video camera of the invention seals the camera components 5 so that they are not in contact with ambient conditions which can contain harmful moisture, dust and the like. The camera components are also protected from vibration as they are held in place by the filler material. Sealing of the camera body 3 against entry of ambient air into the interior 7 thereof is not required. It is not required to enclose the camera body by attaching the back cover 17, however it makes a neater package and facilitates attachment of the required leads to the wires 14. Bracket screws 24 can be threaded through the walls of the camera body 3 for mounting.

It has been found that in cold operating conditions, the apparatus of the invention using the CCD camera does not require a heater for satisfactory operation. The filler material appears to insulate the camera components 5 such that the heat generated by the components is retained instead of being dissipated. In such cold conditions, the silicone compound is preferred as the camera begins to operate and transmit a view faster than when an epoxy compound is used. Satisfactory operation has been obtained at −30 degrees Celsius.

The video camera apparatus is simple and inexpensive to manufacture, and provides significant benefits over conventionally sealing the camera body 3.

The foregoing is considered as illustrative only of the principles of the invention. Further, since numerous changes and modifications will readily occur to those skilled in the art, it is not desired to limit the invention to the exact construction and operation shown and described, and accordingly, all such suitable changes or modifications in structure or operation which may be resorted to are intended to fall within the scope of the claimed invention.

We claim:

1. A video camera apparatus comprising:
    a camera body;
    a lens attached to the camera body and operative to view an exterior of the camera body;
    a plurality of camera components substantially enclosed in an interior of the camera body and operatively connected to the lens;
    connectors leading from the camera components to the exterior of the camera body and operative to transmit images viewed by the lens to a remote viewer;
    a resilient solid filler material substantially covering the camera components and securing the camera components in a fixed location with respect to the camera body, the filler material having sufficient insulating properties to prevent generation of a current through the filler material by voltages normally encountered on exposed portions of the camera components;

wherein the filler material is injected into the camera body in a fluid state, and then hardens to a resilient solid state.

2. The apparatus of claim 1 wherein the filler material substantially fills the interior of the camera body.

3. The apparatus of claim 1 wherein the filler material is a silicone compound.

4. The apparatus of claim 1 wherein the camera components are mounted on a circuit board.

5. A method of assembling a video camera apparatus, the method comprising:

enclosing a plurality of camera components in an interior of a camera body;

attaching a lens to the camera body and orienting the lens such that the lens is operative to view an exterior of the camera body;

operatively connecting the lens to the camera components;

providing connectors leading from the camera components to the exterior of the camera body, the connectors operative to transmit images viewed by the lens to a remote viewer;

injecting a fluid filler material into the camera body so as to substantially cover the camera components and so as to fill at least a portion of a space between each camera component and an interior wall of the camera body to secure the camera components in a fixed location with respect to the camera body when the filler material hardens; and allowing the filler material to harden to a resilient solid state;

wherein the filler material has sufficient insulating properties to prevent generation of a current through the filler material by voltages normally encountered on exposed portions of the camera components.

6. The method of claim 5 wherein the fluid filler material is injected into the camera body until the camera body is substantially filled.

7. The apparatus of claim 5 wherein the filler material is a silicone compound.

8. The method of claim 5 wherein the camera components are mounted on a circuit board.

9. The method of claim 5 wherein the camera components are inserted into the camera body prior to filling the camera body with the filler material.

10. The method of claim 5 wherein the camera components are inserted into the camera body after at least partially filling the camera body with the filler material.

\* \* \* \* \*